(12) United States Patent
Wu et al.

(10) Patent No.: US 11,626,657 B2
(45) Date of Patent: Apr. 11, 2023

(54) ANTENNA PACKAGING MODULE AND MAKING METHOD THEREOF

(71) Applicants: SJ SEMICONDUCTOR (JIANGYIN) CORPORATION, JiangYin (CN); HUAWEI DEVICE CO., LTD., Dongguan (CN)

(72) Inventors: Chengtar Wu, JiangYin (CN); Rui Yu, JiangYin (CN); Chengchung Lin, JiangYin (CN); Xianghui Zhang, JiangYin (CN)

(73) Assignee: HAUWEI DEVICE CO., LTD, Guandong (CN)

( * ) Notice: Subject to any disclaimer, the term of this patent is extended or adjusted under 35 U.S.C. 154(b) by 350 days.

(21) Appl. No.: 16/936,015

(22) Filed: Jul. 22, 2020

(65) Prior Publication Data

US 2021/0066784 A1    Mar. 4, 2021

(30) Foreign Application Priority Data

Jul. 22, 2019  (CN) .......................... 201910662896.2
Jul. 22, 2019  (CN) .......................... 201921157991.9

(51) Int. Cl.
| | | |
|---|---|---|
| *H01Q 1/22* | (2006.01) | |
| *H01L 23/31* | (2006.01) | |
| *H01L 23/498* | (2006.01) | |
| *H01L 21/48* | (2006.01) | |

(Continued)

(52) U.S. Cl.
CPC ....... *H01Q 1/2283* (2013.01); *H01L 21/4853* (2013.01); *H01L 21/4857* (2013.01); *H01L 21/565* (2013.01); *H01L 23/3121* (2013.01); *H01L 23/49822* (2013.01);
(Continued)

(58) Field of Classification Search
CPC ...... H01Q 1/2283; H01Q 1/2291; H01Q 1/38; H01L 21/4853; H01L 21/4857; H01L 21/565; H01L 23/3121; H01L 23/49822; H01L 23/49838; H01L 23/66; H01L 2223/6677; H01L 2224/16227; H01L 2924/15321; H01L 2221/68345; H01L 21/6835; H01P 1/047; H01P 5/028
See application file for complete search history.

(56) References Cited

U.S. PATENT DOCUMENTS

| | | | | |
|---|---|---|---|---|
| 10,804,227 B2* | 10/2020 | Kamgaing | ........ | H01L 23/49822 |
| 11,228,089 B2* | 1/2022 | Wu | .......................... | H01Q 1/38 |
| 2020/0321293 A1* | 10/2020 | Kim | ..................... | H01Q 1/2283 |

* cited by examiner

*Primary Examiner* — Seung H Lee
(74) *Attorney, Agent, or Firm* — Alston & Bird LLP

(57) ABSTRACT

The present disclosure provides an antenna packaging module and the making method. The antenna packaging module comprises a redistribution layer, an antenna structure, a semiconductor chip, a third packaging layer, and a packaging antenna connector to an external circuit board. The antenna structure includes a connector opening and at least a first antenna structure and a second antenna structure stacked on one surface of the redistribution layer. The packaging antenna connector is designed in the connector opening and is electrically connected to the redistribution layer. Electrical terminals are provided through the packaging antenna connector disposed in the connector opening, thus reducing the antenna signal loss. The antenna packaging module requires neither any metal wire ends electrically connected to redistribution layer, nor a flip-chip process.

20 Claims, 5 Drawing Sheets

(51) Int. Cl.
*H01L 21/56* (2006.01)
*H01L 23/66* (2006.01)

(52) U.S. Cl.
CPC ........ *H01L 23/49838* (2013.01); *H01L 23/66* (2013.01); *H01Q 1/2291* (2013.01); *H01L 2223/6677* (2013.01)

providing a packaging antenna structure, the packaging antenna structure includes a redistribution layer, the redistribution layer includes a first surface and a second surface opposite to the first surface; an antenna structure, the antenna structure includes at least the first antenna structure and the second antenna structure stacking on the second surface of the redistribution layer; the first antenna structure includes a first antenna feeder line, a first antenna metal layer, and a first packaging layer, and the first end of the first antenna feeder lines is electrically connected to the redistribution layer, and the first packaging layer encloses the second surface of the redistribution layer and the first antenna feeder line, and exposes the second end of the first antenna feeder line, the first antenna metal layer is disposed on the first packaging layer and electrically connected to the second end of the first antenna feeder line; the second antenna structure includes a second packaging layer and a second antenna metal layer, and the second packaging a layer encloses the first antenna metal layer and the first packaging layer, the second antenna metal layer is disposed on the second packaging layer; a semiconductor chip, the semiconductor chip is disposed on a first surface of the redistribution layer and is electrically connected to the redistribution layer; a third package layer, and the third packaging layer encloses the semiconductor chip and the first surface of the redistribution layer — S001 forming a connector opening in the antenna structure — S002 forming a packaging antenna connector in the connector opening, the packaging antenna connector is electrically connected to the redistribution layer — S003

Fig. 1

ANTENNA PACKAGING MODULE AND MAKING METHOD THEREOF

CROSS REFERENCES TO RELATED APPLICATIONS

This application claims the benefit of priority to Chinese Patent Applications No. CN2019106628962, entitled "An Antenna Packaging Module and Making Method Thereof" and CN2019211579919, entitled "An Antenna Packaging Module", both filed with CNIPO on Jul. 22, 2019, the contents of which are incorporated herein by reference in their entirety.

TECHNICAL FIELD

The disclosure relates to the technical field of semiconductor package, and in particular, to an antenna packaging module and making method thereof.

BACKGROUND

With the widely applied advanced electronic products, especially for those of mobile use, almost all of these products require built-in wireless communication functions.

Based on, the wireless communication device is often built-in chip packaging. One technique Antenna in Packaging (AiP) integrates communication antennas and chips through packaging materials and process. AiP achieves systemic wireless communication. The advantages of AiP include simplified system design, miniatured products and low cost. AiP provides a good antenna in a packaging solution for wireless chips. Under demand of rapid expansion of communication data, AiP has become one of the preferred technologies for 5G communication and in auto-radar chips. As a result, AiP technology has drawn great attention.

In a convectional or partial packaging method, AiP module, antennas are usually directly prepared on a printed circuit board. These antennas interconnect to external environment through connectors mounted on the circuit board, where one surface of the circuit board acts as a radiation surface, and the other surface of the circuit board connects chips and the main structure. The achievability of this partial packaging method is low. It is not compact for modulation and interconnection, because the antennas occupy extra space on the circuit board, resulting in poor integration. For various advanced electronic products, the volume of the circuit board turns out to be bulky if the antennas are directly built on the circuit board. Thus formed electronic products tend to be large as well. Contrary to the need of miniaturization requirement of these advanced electronic products.

On the other hand, wafer-level packaging-antenna (WLP AiP) technology patterns antennas on the packaging layers on a wafer along with the integrated circuits. Compared with the conventional AiP module, WLP AiP has better accuracy and smaller size. WLP AiP has been more widely applied than AiP. However, the present WLP AiP is not supported by current core layers. Plus, the current redistribution layer (RDL) is too thin to interconnect to other components through both surfaces of RDL. Current WLP AiP still relies on the main circuit board to achieve external connection, unable to avoid high loss of packaged antenna. Furthermore, the metal wire ends from the flip-chip interconnect process of current WLP AiP limit the flexibility where the antenna packaging layout is located.

A need exists to have antenna interconnection packaged in a way which can solve the problems of AiP signal loss and layout limitation on the main board.

SUMMARY

The present disclosure provides a method for making an antenna packaging module, comprising the following steps: providing a substrate and a separating layer on top of the substrate; forming a packaging antenna structure over the separating layer, wherein the packaging antenna structure comprises: a redistribution layer, comprising a first surface on the separating layer and a second surface opposite to the first surface; an antenna structure stacked on the second surface of the redistribution layer, wherein the antenna structure comprises a first antenna structure and a second antenna structure; wherein the first antenna structure comprises: a first antenna feeder line, a first antenna metal layer, and a first packaging layer, wherein a first end of the first antenna feeder lines is electrically connected to the second surface of the redistribution layer, and wherein the first packaging layer covers the second surface of the redistribution layer and embeds the first antenna feeder line, except exposing a second end of the first antenna feeder line; and wherein the first antenna metal layer is disposed on the first packaging layer and electrically connected to the second end of the first antenna feeder line; wherein the second antenna structure comprises: a second packaging layer and a second antenna metal layer, wherein the second packaging layer is disposed on the first antenna metal layer and the first packaging layer; and wherein the second antenna metal layer is disposed on the second packaging layer; a semiconductor chip, disposed on the first surface of the redistribution layer and is electrically connected to the redistribution layer; and a third packaging layer, disposed on the semiconductor chip and the first surface of the redistribution layer; wherein the method further comprises: forming a connector opening in the antenna structure; and forming a packaging antenna connector in the connector opening, wherein the packaging antenna connector is electrically connected to the redistribution layer.

Preferably, the packaging antenna connector is interconnected with a circuit board connector on the circuit board, and the packaging antenna connector is electrically connected to the circuit board connector, so that the packaging antenna structure is electrically connected to the circuit board; the circuit board includes one or a combination of a flexible circuit board and a rigid circuit board.

Preferably, the first antenna structure further includes a metal column and a metal connector, the first end of the metal column is electrically connected to the redistribution layer, the first packaging layer embeds the metal column and except exposing the second end of the metal column, and the metal connector is disposed on the first packaging layer and is electrically connected to the second end of the metal column; the metal connector is exposed from the bottom of the connector opening, and the packaging antenna connector is electrically connected to the metal connector, so that the first antenna structure is electrically connected to the redistribution layer through the metal connector and the metal column.

Preferably, a metal wiring of the redistribution layer is exposed from a bottom of the connector opening, and the packaging antenna connector is electrically connected to the metal wiring.

Preferably, a dielectric layer is disposed between the first antenna structure and the second antenna structure.

Preferably, the second antenna structure further includes a second antenna feeder line disposed between the second antenna metal layer and the first antenna metal layer, and the second antenna metal layer is connected to the first antenna metal layer through the second antenna feeder line.

Preferably, forming the packaging antenna connector in the connector opening includes one or a combination of reflow welding and laser welding.

Preferably, forming the first antenna feeder line includes one or a combination of a wire bonding method, electroplating, and electroless plating, the material of the first antenna feeder line includes one or a combination of copper, gold, silver, and aluminum.

Preferably, forming the connector opening includes one or a combination of dry etching and wet etching.

Preferably, the semiconductor chip includes one or a combination of an active component and a passive component; the active component includes one or a combination of a transceiver chip and a power management chip; the passive component includes one or a combination of a resistor and a capacitor and inductances.

Preferably, the package antenna module includes one or a combination of a GPS antenna, an FM earphone antenna, a WIFI antenna, a BT antenna, a diversity antenna, and a main antenna.

The present disclosure further provides an antenna packaging module, comprising: a substrate and a separating layer; a redistribution layer, and the redistribution layer includes a first surface on the separating layer and a second surface opposite to the first surface; an antenna structure, the antenna structure comprises a connector opening and at least a first antenna, and a second antenna stacking stacked on the second surface of the redistribution layer, and a connector opening; wherein the first antenna structure includes a first antenna feeder line, a first antenna metal layer and a first packaging layer, wherein the a first end of the first antenna feeder line is electrically connected to the redistribution layer, wherein the first packaging layer encloses is disposed on the first antenna feeder line and exposes a second end of the first antenna feeder line exposed, wherein the first antenna metal layer is disposed on the first packaging layer and electrically connected to the second end of the first antenna feeder line; wherein the second antenna structure includes a second packaging layer and a second antenna metal layer, wherein the second packaging layer encloses is disposed on the first antenna metal layer, and wherein the second antenna metal layer is disposed on the second packaging layer; wherein the antenna packaging module further comprises: a semiconductor chip, wherein the semiconductor chip is disposed on a the first surface of the redistribution layer and electrically connected to the redistribution layer; a third packaging layer, disposed on and the third packaging layer encloses the semiconductor chip and the first surface of the redistribution layer; and a packaging antenna connector, and the packaging antenna connector is disposed in the connector opening, wherein the packaging antenna connector and is electrically connected to the redistribution layer.

Preferably, the packaging antenna connector is connected with a circuit board connector on a circuit board, wherein the circuit board comprises one or a combination of a flexible circuit board and a rigid circuit board.

Preferably, the first antenna structure further includes a metal column and a metal connector, and the first end of the metal column is electrically connected to the redistribution layer, and the first packaging layer is disposed on the second surface of the redistribution layer and also on the metal column, only exposing the second end of the metal column, the metal connector is disposed on the first packaging layer and is electrically connected to the second end of the metal column; the metal connector is exposed from the bottom of the connector opening, the packaging antenna connector is electrically connected to the second surface of the metal connector, so as to be electrical connected to the redistribution layer through the metal connector and the metal column.

Preferably, a metal wiring of the redistribution layer is exposed from a bottom of the connector opening, and the packaging antenna connector is electrically connected to the metal wiring.

Preferably, a dielectric layer is disposed between the first antenna structure and the second antenna structure.

Preferably, the second antenna structure further includes a second antenna feeder line disposed between the second antenna metal layer and the first antenna metal layer, and the second antenna metal layer is connected to the first antenna metal layer through the second feeder line.

Preferably, the first antenna feeder line includes one or a combination of a copper feeder line, a gold feeder line, a silver feeder line, and an aluminum feeder line.

Preferably, the semiconductor chip includes one or a combination of an active component and a passive component; the active component includes one or a combination of a transceiver chip and a power management chip; the passive component includes one or a combination of a resistor, a capacitor and inductances.

Preferably, the antenna packaging module includes one or a combination of a GPS antenna, an FM earphone antenna, a WIFI antenna, a BT antenna, a diversity antenna, and a main antenna.

BRIEF DESCRIPTION OF THE DRAWINGS

FIG. 1 is a flow chart illustrating the process of making the packaging antenna module according to some embodiment of the present disclosure.

DESCRIPTION OF COMPONENT REFERENCE SIGNS

Figure 2:
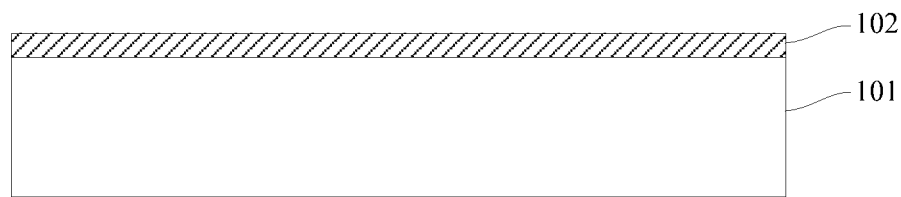
FIGS. 2 to 7 are schematic diagrams after the steps of making the packaging antenna module according to the first embodiment of the present disclosure.

101 Support substrate
102 Separation layer
103, 203 Redistribution layer
113, 213 Wiring dielectric
123, 223 Metal wiring
104, 204 First antenna structure
1141, 214 First feeder line
1142 Metal column
124, 224 First packaging layer 1341, 234 First antenna metal layer
1342 Metal connector
105, 205 Dielectric layer
106, 206 Second antenna structure
116, 216 Second packaging layer
126, 226 Second antenna metal layer
107, 207 Semiconductor chip
108, 208 Third packaging layer
109, 209 Connector opening
110, 210 Connector
111, 211 Packaging antenna connector
112, 212 Circuit board connector
120, 220 Circuit board

DETAILED DESCRIPTION OF THE PREFERRED EMBODIMENTS

The embodiments of the present disclosure will be described below through specific examples. One skilled in the art can easily understand other advantages and effects of the present disclosure according to content disclosed in the description. The present disclosure may also be implemented or applied through other different embodiments, and various modifications or changes may be made to all details in the description based on different points of view and applications without departing from the spirit of the present disclosure.

It should be noted that, figures provided in embodiments describe the basic idea of the present disclosure only in a schematic manner; only components related to the present disclosure are shown in the figures instead of drawing components based on the quantity, the shape, and the size of the components required during actual implementation. The shape, the quantity, and the ratio of each component during actual implementation can be changed randomly, and the layout shape of the components may be more complicated.

Embodiment 1

Figure 8:
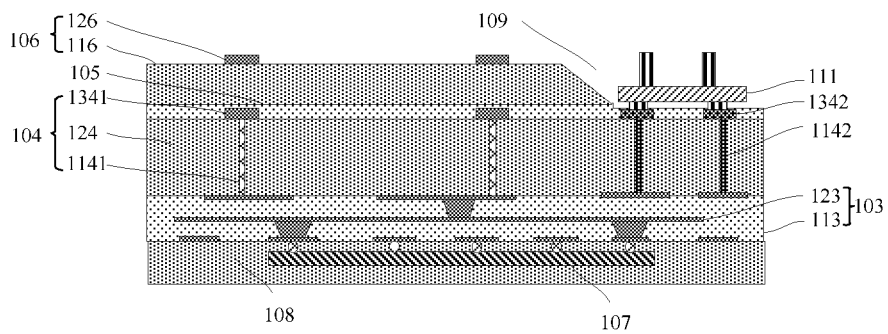
FIG. 8 is a schematic diagram of the packaging antenna module according to the first embodiment of the present disclosure.

FIG. 8 provides an overview of the antenna packaging module structure in the embodiment 1. In FIG. 8, there is an antenna packaging module which includes a redistribution layer 103, an antenna structure, a semiconductor chip 107, a third packaging layer 108, and a packaging antenna connector 111. The redistribution layer 103 includes a first surface and a second surface opposite to the first surface. The antenna structure includes a connector opening 109, and at least a first antenna structure 104 and a second antenna structure 106 stacking on the second surface of the redistribution layer 103. The first antenna structure 104 includes a first antenna feeder line 1141, a first antenna metal layer 1341 and a first packaging layer 124. The first end of the first antenna feeder line 1141 is electrically connected to the redistribution layer 103. The first packaging layer 124 embeds the first antenna feeder line 1141 only exposing the second end of the first antenna feeder line 1141. The first antenna metal layer 1341 is disposed on the first packaging layer 124 and is electrically connected to the second end of the first antenna feeder line 1141. The second antenna structure 106 includes a second packaging layer 116 and a second antenna metal layer 126. The second packaging layer 116 encloses the first antenna metal layer 1341. The second antenna metal layer 126 is disposed on the second packaging layer 116. The semiconductor chip 107 is disposed on the first surface of the redistribution layer 103 and is electrically connected to the redistribution layer 103. The third packaging layer 108 encloses the semiconductor chip 107 and the first surface of the redistribution layer 103. The packaging antenna connector 111 is disposed in the connector opening 109 and is electrically connected to the redistribution layer 103.

In this embodiment of the antenna packaging module, the packaging antenna connector disposed in the connector opening is electrically connected to the redistribution layer via the connector opening, and electrical extracted by the packaging antenna connector, so that the antenna packaging module can directly interconnect with the external. The embodiment does not require fabricating metal protrusions connecting to the redistribution layer and does not require electrical connection by flip flop process, therefore it can reduce signal loss, improve the flexibility of the location layout of the packaging antenna and further improve the overall competitive advantage of WLP AiP.

As shown in FIG. 1, the embodiment provides a flow chart of a method how to make the antenna packaging module, but the method for making the antenna packaging module is not limited herein.

There are 3 major steps making the antenna packaging module, described in the following text.

S001: fabricate a packaging antenna structure;
S002: forming a connector opening in the antenna structure;
S003: forming a packaging antenna connector in the connector opening, which is electrically connected to the RDL.

Specifically, as shown in FIGS. 2 to 8, schematic diagrams illustrate the packaging antenna module after each step in the method according to the embodiment.

Referring to FIG. 2, a support substrate 101 is first provided, and a separation layer 102 is formed on the support substrate 101.

Specifically, the support substrate 101 may be selected from a glass substrate, a metal substrate, a semiconductor substrate, a polymer substrate and a ceramic substrate. The separation layer 102 may include a polymer layer having a reduced viscosity under heat treatment or illumination, and the polymer layer may include a light-to-heat conversion (LTHC) layer. Choosing a glass substrate might be preferred because it's cost is low and also forming the separation layer 102 on the surface of a glass substrate reduces some challenges of subsequent peeling process. The separation layer 102 is preferably coated on the surface of the support substrate 101 by a spin coating process, followed by curing with UV light or heat treatment to form a LHTC layer. In the subsequent stripping process, the LHTC layer can be heated to separate from the support substrate 101 with laser light.

Figure 3:
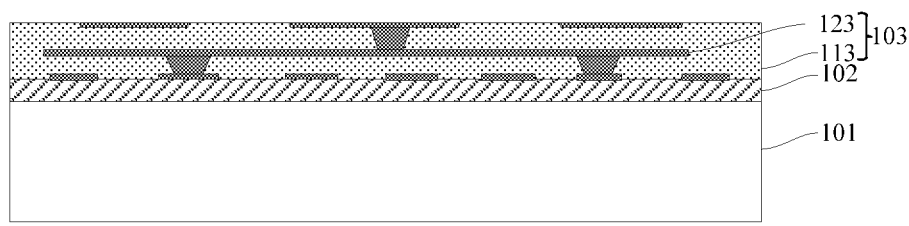

As shown in FIG. 3, the redistribution layer 103 is formed on the separation layer 102. The redistribution layer 103 includes a first surface contacting the separation layer 102 and a second surface opposite to the first surface.

Specifically, the redistribution layer 103 includes a wiring dielectric 113 and a metal wiring 123. The materials of the wiring dielectric 113 may include one or a combination of epoxy resin, silica gel, polyimide (PI), phenylene benzabisoxazole (PBO), benzocyclobutene (BCB), silicon oxide, phosphosilicate glass, and fluorine-containing glass. The materials of the metal wiring 123 may include one or a combination of copper, aluminum, nickel, gold, silver, and titanium. The method for making the wiring dielectric 113 may include one or a combination of physical vapor deposition and chemical vapor deposition. The method for fabricating the metal wiring 123 may include one or a combination of physical vapor deposition, chemical vapor deposition, electroplating, and electroless plating. The materials, the number of layers and the distribution of the wiring dielectric 113 and the metal wiring 123 can be selected according to specific needs, which are not limited to what is mentioned above.

Figure 4:
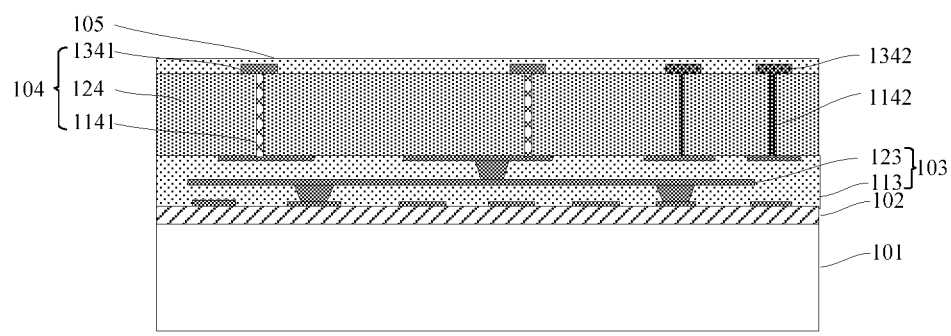

As shown in FIG. 4, the first antenna structure 104 is formed on the second surface of the redistribution layer 103.

Exemplarily, the first antenna structure 104 may further include metal columns 1142 and a metal connector 1342. The first end of the metal column 1142 is electrically connected to the second surface of the redistribution layer 103. The first packaging layer 124 is disposed on the second surface of the redistribution layer 103 and embedding the metal column 1142, however, the second end of the metal column 1142 are exposed. Each metal connector 1342 is disposed on the first packaging layer 124, is then patterned to align to the second end of the metal column 1142 so they are electrically connected.

Specifically, in the embodiment, the metal connector 1342 is exposed from the bottom of the connector opening 109. The packaging antenna connector 111 is electrically connected to the redistribution layer 103 through the metal connector 1342 and the metal column 1142.

Forming the first antenna structure 104 may include:

Forming the first antenna feeder line 1141 and the metal column 1142 on the second surface of the redistribution layer 103. The method of forming may include patterning via holes in the first packaging layer, followed by filling metal interconnecting materials. The method may also include welding metal wires on the second surface of the redistribution layer before deposing the first packaging layer. The first end of the first antenna feeder line 1141 and the first end of the metal column 1142 are electrically connected to the redistribution layer 103.

Forming the first packaging layer 124 on the second surface of the redistribution layer 103. The first redistribution layer 124 encloses the second surface of the redistribution layer 103, the first antenna feeder line 1141 and the metal column 1142, and exposes a second end of the first antenna feeder line 1141 and a second end of the metal column 1142.

The first antenna metal layer 1341 and the metal connector 1342 is formed on the first packaging layer 124, and the first antenna metal layer 1341 is electrically connected to the second end of the first antenna feeder line 1141, and the metal connector 1342 is electrically connected to the second end of the metal column 1142.

As an example, the method for forming the first antenna feeder line 1141 may include one or a combination of wire bonding, electroplating, and electroless plating. The material of the first antenna feeder line 1141 may include one or a combination of copper, gold, silver, and aluminum. The method for forming the metal column 1142 may include one or a combination of wire bonding, electroplating, and electroless plating. The material of the metal column 1142 may include one or a combination of copper, gold, silver, and aluminum.

Specifically, it is preferable that the first antenna feeder line 1141 and the metal column 1142 are made of the same material, so that the first antenna feeder line 1141 and the metal column 1142 can be formed in the same process. The first antenna metal layer 1341 and the metal connector 1342 can be formed in the same process to improve production efficiency and reduce production cost.

As an example, the material of the first packaging layer 124 may include one of polyimide, silica gel, and epoxy resin. The method for forming the first packaging layer 124 may include one of compression molding, transfer molding, liquid sealing molding, vacuum lamination, and spin coating. After forming the first packaging layer 124, a chemical mechanical polishing method may be applied to the top surface of the first packaging layer 124 to provide a flattened first packaging layer 124 to further improve product quality.

As an example, the method for forming the first antenna metal layer 1341 and the metal connection 1342 may include one or a combination of physical vapor deposition, chemical vapor deposition, electroplating, or electroless plating.

Specifically, a metal layer is formed on the surface of the first packaging layer 124 by physical vapor deposition or chemical vapor deposition, and then the metal layer is patterned form the first antenna metal layer 1341 and the metal connector 1342. Alternatively, the first antenna metal layer 1341 and the metal connector 1342 may be formed by using an electroplating process or an electroless plating process. For example, a metal seed layer is formed on the surface of the first packaging layer 124, and then patterned photoresist is formed, the first antenna metal layer 1341 and the metal connector 1342 are formed by electroplating, and finally the photoresist and the exceeded metal seed layer are removed.

As an example, a dielectric layer 105 may be disposed between the first antenna structure 104 and the second antenna structure 106 formed subsequently.

As shown in FIG. 4, the dielectric layer 105 encloses the first packaging layer 124, the first antenna metal layer 1341 and the metal connector 1342. The dielectric layer 105 can improve the bonding force between the second packaging layers 116 and the first packaging layer 124, so as to improve the stability of the packaging antenna structure. The dielectric layer 105 can be formed by using material and making method the same as those of the first packaging layer 124, which can reduce the complexity of process and improve the bonding properties between the first packaging layer 124 and the second packaging layer 116.

Figure 5:
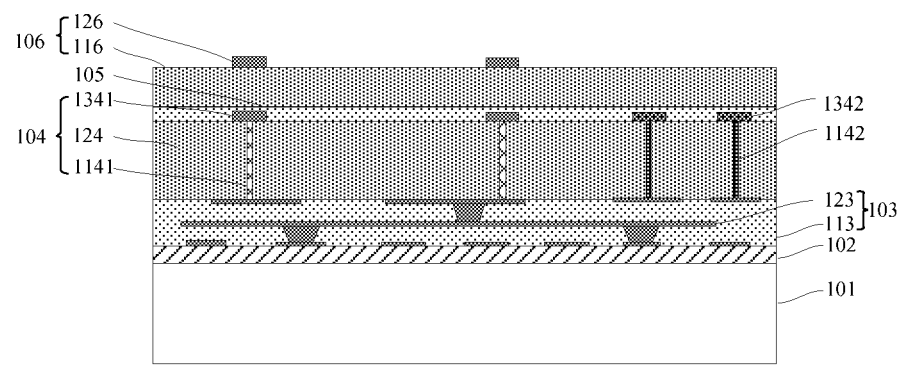

As shown in FIG. 5, the second antenna structure 106 is formed.

Specifically, the second antenna structure 106 includes the second packaging layer 116 and the second antenna metal layer 126. The second packaging layer 116 encloses the dielectric layer 105, and the second antenna metal layer 126 is disposed on the second packaging layer 116. The material and the making method of the second antenna structure 106 are the same as those of the first antenna structure 104, which is not described herein. Preferably, the second packaging layer 116, the dielectric layer 105, and the first packaging layer 124 use the same material to improve stability of the structure.

As an example, the second antenna metal layer 126 has an opening in a vertical region of the metal connector 1342 to prevent the second antenna metal layer 126 from blocking the metal connector 1342, and further reduce the difficulty and cost of the subsequent process of removing the second packaging layer 116 and exposing the metal connector 1342.

As an example, the second antenna structure 106 may further include the second feeder line (not shown herein) disposed between the second metal layer 126 and the first antenna metal layer 1341 to further reduce the signal loss of the packaging antenna structure.

As an example, a stacked N-layer antenna structure is disposed on the second surface of the rewiring layer 103, N>2. The stacked N-layer antenna structure can further improve the integration and performance of the packaging antenna structure.

Specifically, in this embodiment, the N is 2. That is, the first antenna structure 104 and the second antenna structure 106 are stacked on the second surface of the rewiring layer 103. In other embodiment, the N may be 3, 4, 5, etc., to further improve the integration degree and performance of the packaging antenna structure. The specific value of the N is not limited herein.

Figure 6:
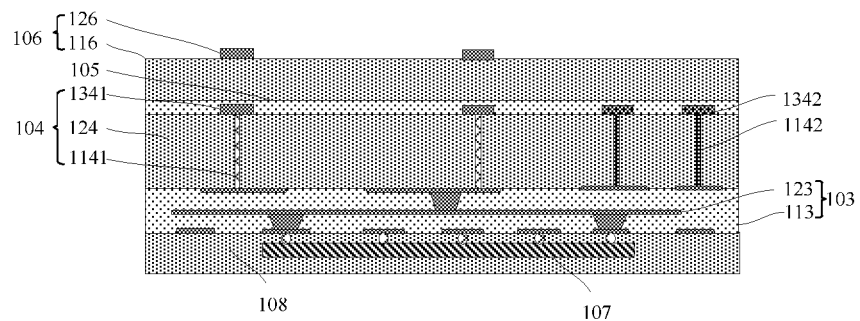

As shown in FIG. 6, the first surface of the redistribution layer 103 is exposed via removing the separation layer 102 and the support substrate 101. The semiconductor chip 107 and the third packaging layer 108 are formed on the first surface of the redistribution layer 103.

Specifically, the third packaging layer 108 can protect the redistribution layer 103 and the semiconductor chip 107, and the third packaging layer 108 can also be used as a support layer to improve the structural stability. The material and making method of the third packaging layer 108 can be the same as those of the first packaging layer 124, which are not described herein.

As an example, the semiconductor chip 107 may include one or a combination of an active component and a passive component. The active component may include one or a combination of a transceiver integrated chip and a power management chip. The passive component may include one or a combination of a resistor, a capacitor and an inductor.

Figure 7:
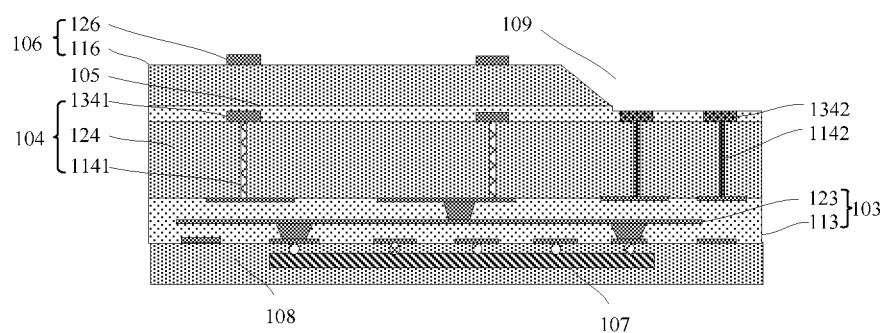

Then, as shown in FIG. 7, a connector opening 109 is formed in the antenna structure.

Specifically, in this embodiment, the metal connector 1342 is exposed by removing part of the second encapsulating layer 116 and the dielectric layer 105. The method for removing the second packaging layer 116 and the dielectric layer 105 may include one or a combination of dry etching and wet etching.

Then, as shown in FIG. 8, the packaging antenna connector 111 is formed in the connector opening 109. The packaging antenna connector 111 is electrically connected to the redistribution layer 103.

As an example, the method for forming the packaging antenna connector 111 in the connector opening 109 includes one or a combination of reflow welding and laser welding.

Specifically, the kind of the packaging antenna connector 111 is not limited herein. In the embodiment, the packaging antenna connector 111 is electrically connected to the metal connector 1342 by reflow welding. The antenna connector 111 is electrically connected to the redistribution layer 103 through the metal connector 1342 and the metal column 1142. After forming the packaging antenna connector 111, a cleaning step may be performed to remove the welding debris.

As an example, the packaging antenna connector 111 is matched with the circuit board connector 112 on the circuit board 120. The packaging antenna connector 111 and the circuit board connector 112 are electrically connected so that the packaging antenna structure is electrically connected to the circuit board. The circuit board 120 includes one or a combination of a flexible circuit board and a rigid circuit board.

Figure 9:
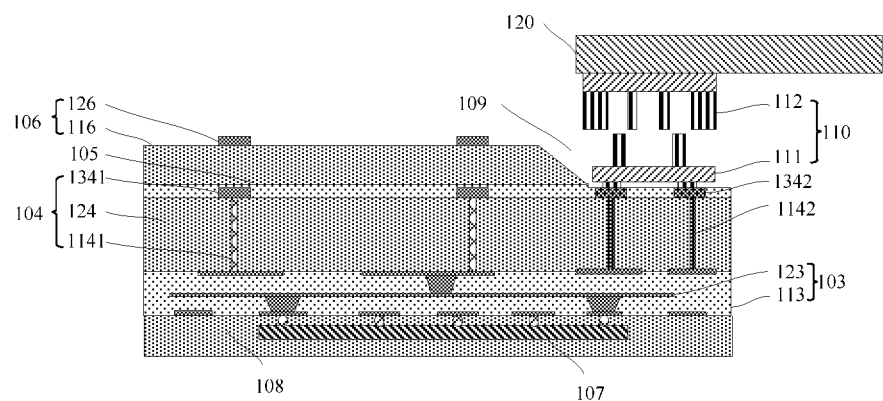
FIG. 9 is a schematic diagram of the packaging antenna module interconnecting with a circuit board according to the first embodiment of the present disclosure.

Specifically, as shown in FIG. 9, the circuit board 120 and the circuit board connector 112 are provided. The circuit board 120 may include one or a combination of a flexible circuit board and a rigid circuit board. The circuit board connector 112 is electrically connected to the circuit board 120, and is matched with the packaging antenna connector 111, so as to form a connector 110 capable of good electrical connection. The first packaging layer 124 can serve as a core layer to provide support.

As an example, the antenna packaging module may include one or a combination of a GPS antenna, an FM headphone antenna, a WIFI antenna, a BT antenna, a diversity antenna, and a main antenna.

Specifically, the antenna packaging module is electrically extracted through the packaging antenna connector 111, so that the antenna packaging module can directly interconnect with the external, thereby reducing signal loss. The antenna packaging module does not require the metal protrusions electrically connected to redistribution layer 103, and does not require electrical connection by the flip-chip process. The antenna packaging module directly uses the packaging antenna connector 111 as the electrical extraction terminal so that can improve the flexibility of the position layout of the packaging module. The antenna packaging module can be flexibly applied to devices such as mobile phones, computers, smart homes, etc. For example, in the case of a mobile phone, the antenna packaging module may include one or a combination of a GPS antenna, a FM earphone antenna, a WIFI antenna, a BT antenna, a diversity antenna, and a main antenna. The circuit board 120 may be a mobile phone shell.

Embodiment 2

Figure 11:
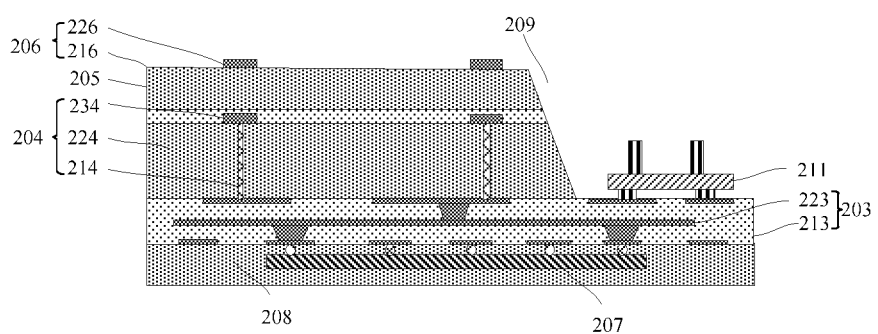
Figure 12:
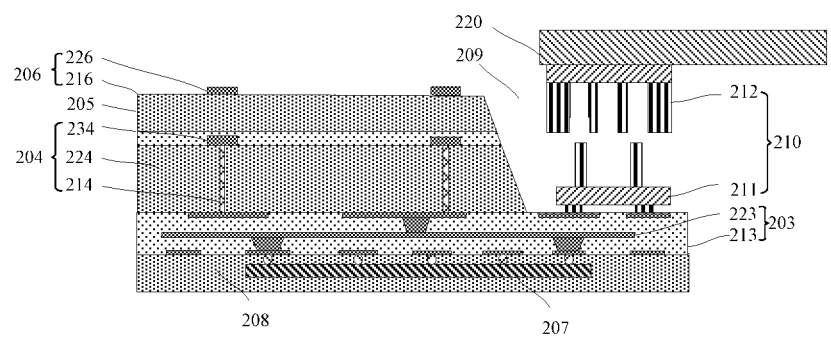
FIG. 12 is a schematic diagram illustrating packaging antenna module in the second embodiment interconnecting with a circuit board according to the second embodiment of the present disclosure.

The Embodiment 2 is disclosed in FIG. 11 and FIG. 12. Referring to FIG. 11, which is a schematic cross sectional diagram of an antenna packaging module according to this embodiment. This embodiment differs from the first embodiment in the position of the connector opening in the antenna packaging module, such that where to make an opening for the packaging antenna connector has more options.

The antenna packaging module includes a redistribution layer 203, an antenna structure, a semiconductor chip 207, a third packaging layer 208, and a packaging antenna connector 211. The redistribution layer 203 includes the first surface and the second surface opposite to the first surface. The antenna structure includes connector opening 209 and at least the first antenna structure 204 and the second antenna structure 206 stacking on the second surface of the redistribution layer 203. The first antenna structure includes the first feeder line 214, the first antenna metal layer 234 and the first packaging layer 224. The first end of the first feeder line 214 is electrically connected to the redistribution layer 203. The first packaging layer 224 embeds the first feeder line 214 except exposing the second end of the first feeder line 214. The first antenna metal layer 234 is disposed on the first packaging layer 224 and electrically connected to the second end of the first feeder line 214. The second antenna structure 206 includes the second packaging layer 216 and the second antenna metal layer 226. The second packaging layer 216 is disposed on the first antenna metal layer 234, and the second metal layer 226 is disposed on the second packaging layer 216. The semiconductor chip 207 is disposed on the first surface of the redistribution layer 203, and is electrically connected to the redistribution layer 203. The third packaging layer is disposed over the first surface of the redistribution layer 203 embedding the semiconductor chip 207. The packaging antenna connector 211 is disposed in the connector opening 209, and is electrically connected to the redistribution layer 203.

As an example, the metal wiring 223 of the redistribution layer 203 is exposed from the bottom of the connector opening 209. The packaging antenna connector 211 is electrically connected to the metal wiring 223.

Specifically, the redistribution layer 203 includes a wiring dielectric 213 and the metal wiring 223. In this embodiment, the bottom of the connector opening 209 directly exposes the metal wiring 223 of the redistribution layer 203. The packaging antenna connector 211 is electrically connected to the metal wiring 223, so that the electrical extraction is achieved through the packaging antenna connector 211, and the selection range of the packaging antenna connector 211 is broadened.

Figure 10:
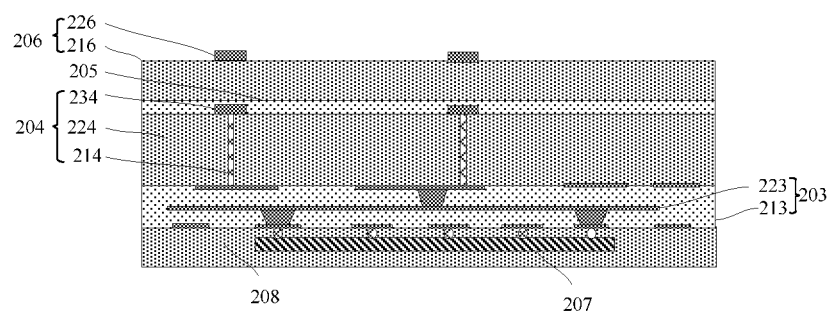
FIG. 10 and FIG. 11 are schematic diagrams illustrating the packaging antenna module according to the second embodiment of the present disclosure.

FIG. 10 and FIG. 11 are schematic diagrams illustrating the structure of the antenna packaging module in the embodiment. The dielectric layer 205 may further be included between the first antenna structure 204 and the second antenna structure 206. The specific structure and making method for the antenna packaging module may refer to the first embodiment, details are not described herein.

As shown in FIG. 12, a circuit board 220 and a circuit board connector 212 are provided. The circuit board 220 may include one or a combination of a flexible circuit board and a rigid circuit board. The circuit board connector 212 and the circuit board 220 is electrically connected, and is matched with the packaging antenna connector 211, so as to form a connector 210 capable of electrical connection. The third package layer 208 acts as a core layer to provide mechanical support.

In summary, in the antenna packaging module and the making method thereof according to the second embodiment, the packaging antenna connector disposed in the connector opening is electrically connected to the redistribution layer, the antenna packaging module is electrically interconnected with the packaging antenna connector. The antenna packaging module can be directly connected with the external circuit board, thereby reducing signal loss. The antenna packaging module does not require the metal wire ends electrically connecting to the redistribution layer, and also does not involve electrical connection by the flip-chip process. The antenna packaging module directly uses the packaging antenna as the electrical interconnect terminal. As a result, the flexibility of antenna packaging module layout is improved. Overall competitive advantage of WLP AiP is enhanced.

The above-mentioned disclosures are only for exemplarily describing the structures and methods instead of limiting the embodiments. One skilled in the art may make modifications or changes to the above-mentioned embodiments without departing from the spirit and scope of the present disclosure. Therefore, all equivalent modifications or changes made by those who have common knowledge in the art without departing from the spirit and technical thought described above shall be still included by the claims of the present application. Modifications or variations of the above-described embodiments may be made by those skilled in the art without departing from the spirit and scope of the invention.

The invention claimed is:

1. A method for making an antenna packaging module, comprising the following steps:
providing a substrate and a separating layer on top of the substrate;
forming a packaging antenna structure over the separating layer, wherein the packaging antenna structure comprises:
a redistribution layer, comprising a first surface on the separating layer and a second surface opposite to the first surface;
an antenna structure stacked on the second surface of the redistribution layer, wherein the antenna structure comprises a first antenna structure and a second antenna structure;
wherein the first antenna structure comprises:
a first antenna feeder line, a first antenna metal layer, and a first packaging layer, wherein a first end of the first antenna feeder lines is electrically connected to the second surface of the redistribution layer, and wherein the first packaging layer covers the second surface of the redistribution layer and embeds the first antenna feeder line, except exposing a second end of the first antenna feeder line; and
wherein the first antenna metal layer is disposed on the first packaging layer and electrically connected to the second end of the first antenna feeder line, wherein the first antenna feeder lines are welded on the second surface of the redistribution layer before the first packaging layer is deposed on the second surface of the redistribution layer;
wherein the second antenna structure comprises:
a second packaging layer and a second antenna metal layer, wherein the second packaging layer is disposed on the first antenna metal layer and the first packaging layer; and wherein the second antenna metal layer is disposed on the second packaging layer;
a semiconductor chip, disposed on the first surface of the redistribution layer and is electrically connected to the redistribution layer; and
a third packaging layer, disposed on the semiconductor chip and the first surface of the redistribution layer;
wherein the method further comprises:
forming a connector opening in the antenna structure;
forming a packaging antenna connector in the connector opening, wherein the packaging antenna connector is electrically connected to the redistribution layer; and
connecting the packaging antenna connector as an electrical interconnect terminal with a circuit board connector of an external circuit board.

2. The method for making an antenna packaging module according to claim 1, wherein the packaging antenna connector is electrically connected to the circuit board connector, so that the packaging antenna structure is electrically connected to the external circuit board; wherein the external circuit board comprises one or a combination of a flexible circuit board and a rigid circuit board.

3. The method for making an antenna packaging module according to claim 1, wherein the first antenna structure further comprises a metal column and a metal connector, wherein a first end of the metal column is electrically connected to the redistribution layer, wherein the first packaging layer embeds the metal column except exposing a second end of the metal column, wherein the metal connector is disposed on the first packaging layer and is electrically connected to the second end of the metal column; wherein the metal connector is exposed from a bottom of the connector opening, wherein the packaging antenna connector is electrically connected to the metal connector, so that the first antenna structure is electrically connected to the redistribution layer through the metal connector and the metal column.

4. The method for making an antenna packaging module according to claim 1, wherein a metal wiring of the redistribution layer is exposed from a bottom of the connector opening, and wherein the packaging antenna connector is electrically connected to the metal wiring.

5. The method for making an antenna packaging module according to claim 1, wherein a dielectric layer is disposed between the first antenna structure and the second antenna structure.

6. The method for making an antenna packaging module according to claim 1, wherein the second antenna structure further comprises a second antenna feeder line disposed between the second antenna metal layer and the first antenna metal layer, and the second antenna metal layer is connected to the first antenna metal layer through the second antenna feeder line.

7. The method for making the antenna packaging module according to claim 1, wherein forming the packaging antenna connector in the connector opening comprises one or a combination of reflow welding and laser welding.

8. The method for making an antenna packaging module according to claim 1, wherein forming the first antenna feeder line comprises one or a combination of a wire bonding method, electroplating, and electroless plating, wherein a material of the first antenna feeder line comprises one or a combination of copper, gold, silver, and aluminum.

9. The method for making an antenna packaging module according to claim 1, wherein forming the connector opening comprises one or a combination of dry etching and wet etching.

10. The method for making an antenna packaging module according to claim 1, wherein the semiconductor chip includes one or a combination of an active component and a passive component; the active component comprises one or a combination of a transceiver integrated chip and a power management chip; wherein the passive component comprises one or a combination of a resistor, a capacitor, and an inductor.

11. The method for making an antenna packaging module according to claim 1, wherein the antenna packaging module comprises one or a combination of a GPS antenna, an FM earphone antenna, a WIFI antenna, a BT antenna, a diversity antenna, and a main antenna.

12. An antenna packaging module, comprising:
a substrate and a separating layer;
a redistribution layer, wherein the redistribution layer comprises a first surface on the separating layer and a second surface opposite to the first surface;
an antenna structure, wherein the antenna structure comprises a first antenna, and a second antenna stacked on the second surface of the redistribution layer and a connector opening;
wherein the first antenna structure includes a first antenna feeder line, a first antenna metal layer and a first packaging layer, wherein a first end of the first antenna feeder line is electrically connected to the redistribution layer, wherein the first packaging layer is disposed on the first antenna feeder line leaving a second end of the first antenna feeder line exposed, wherein the first antenna metal layer is disposed on the first packaging layer and electrically connected to the second end of the first antenna feeder line;
wherein the first antenna feeder lines are connected on the second surface of the redistribution layer and embedded in the first packaging layer;
wherein the second antenna structure includes a second packaging layer and a second antenna metal layer, wherein the second packaging layer is disposed on the first antenna metal layer, and wherein the second antenna metal layer is disposed on the second packaging layer;

wherein the antenna packaging module further comprises:
a semiconductor chip disposed on the first surface of the redistribution layer and electrically connected to the redistribution layer;
a third packaging layer, disposed on the semiconductor chip and the first surface of the redistribution layer; and
a packaging antenna connector disposed in the connector opening, wherein the packaging antenna connector is connected electrically connected to the redistribution layer, and wherein the packaging antenna connector is connected as an electrical interconnect terminal with a circuit board connector of an external circuit board.

13. The antenna packaging module according to claim 12, wherein the external circuit board comprises one or a combination of a flexible external circuit board and a rigid external circuit board.

14. The antenna packaging module according to claim 12, wherein the first antenna structure further comprises a metal column and a metal connector, wherein a first end of the metal column is electrically connected to the redistribution layer, wherein the first packaging layer is disposed on the second surface of the redistribution layer and also on the metal column, only exposing a second end of the metal column, wherein the metal connector is disposed on the first packaging layer and is electrically connected to the second end of the metal column; wherein the metal connector is exposed from a bottom of the connector opening, wherein the packaging antenna connector is electrically connected to the metal connector, so as to electrically connect to the second surface of redistribution layer through the metal connector and the metal column.

15. The antenna packaging module according to claim 12, wherein a metal wiring of the redistribution layer is exposed from a bottom of the connector opening, and wherein the packaging antenna connector is electrically connected to the metal wiring.

16. The antenna packaging module according to claim 12, wherein a dielectric layer is disposed between the first antenna structure and the second antenna structure.

17. The antenna packaging module according to claim 12, wherein the second antenna structure further comprises a second antenna feeder line disposed between the first antenna metal layer and the second antenna metal layer, wherein the first antenna metal layer is connected to the second antenna metal layer through the second feeder line.

18. The antenna packaging module according to claim 12, wherein t the first antenna feeder line comprises one or a combination of a copper line, a gold line, a silver line, and an aluminum line.

19. The antenna packaging module according to claim 12, wherein the semiconductor chip comprises one or a combination of an active component and a passive component; wherein the active component comprises one of a transceiver chip and a power management chip; and wherein the passive component comprises one or a combination of a resistor, a capacitor, and an inductor.

20. The antenna packaging module according to claim 12, wherein comprising one of a combination of a GPS antenna, a FM earphone antenna, a WIFI antenna, a BT antenna, a diversity antenna, and a main antenna.

* * * * *

UNITED STATES PATENT AND TRADEMARK OFFICE
CERTIFICATE OF CORRECTION

PATENT NO. : 11,626,657 B2
APPLICATION NO. : 16/936015
DATED : April 11, 2023
INVENTOR(S) : Chengtar Wu et al.

Page 1 of 1

It is certified that error appears in the above-identified patent and that said Letters Patent is hereby corrected as shown below:

On the Title Page

Item [73] Assignee, should read: --SJ SEMICONDUCTOR (JIANGYIN) CORPORATION, JiangYin (CN) and HAUWEI DEVICE CO., LTD, Guandong (CN)--.

Signed and Sealed this
Fourth Day of June, 2024

Katherine Kelly Vidal
*Director of the United States Patent and Trademark Office*